(12) United States Patent
Shin et al.

(10) Patent No.: US 9,653,183 B1
(45) Date of Patent: May 16, 2017

(54) SHARED BUILT-IN SELF-ANALYSIS OF MEMORY SYSTEMS EMPLOYING A MEMORY ARRAY TILE ARCHITECTURE

(71) Applicant: QUALCOMM Incorporated, San Diego, CA (US)

(72) Inventors: Hyunsuk Shin, San Diego, CA (US); Sungryul Kim, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/254,068

(22) Filed: Sep. 1, 2016

(51) Int. Cl.
G11C 29/00 (2006.01)
G11C 29/18 (2006.01)
G11C 11/16 (2006.01)
G11C 29/12 (2006.01)

(52) U.S. Cl.
CPC ........... *G11C 29/18* (2013.01); *G11C 11/165* (2013.01); *G11C 29/1201* (2013.01)

(58) Field of Classification Search
CPC ... G11C 29/04; G11C 29/006; G11C 29/1201; G11C 29/18; G11C 29/26; G11C 11/165
USPC .............. 365/158, 148, 163, 185.02, 185.09, 365/189.07, 200, 201
See application file for complete search history.

(56) References Cited

U.S. PATENT DOCUMENTS

| 5,987,632 | A | * | 11/1999 | Irrinki | G11C 29/44 365/201 |
| 6,667,917 | B1 | * | 12/2003 | Templeton | G11C 29/14 365/201 |
| 6,795,355 | B2 | * | 9/2004 | Ooishi | G11O 5/147 365/158 |
| 6,993,692 | B2 | | 1/2006 | Ouellette et al. | |
| 8,201,032 | B2 | | 6/2012 | Evans et al. | |
| 8,358,549 | B2 | | 1/2013 | Tomiyama | |
| 8,929,167 | B2 | | 1/2015 | Kim et al. | |
| 9,336,342 | B2 | | 5/2016 | Zorian et al. | |

* cited by examiner

*Primary Examiner* — Tan T. Nguyen
(74) *Attorney, Agent, or Firm* — Withrow & Terranova, PLLC (57) ABSTRACT

Shared built-in self-analysis of memory systems employing a memory array tile architecture is provided. To selectively control which memory tile among a plurality of memory tiles is accessed for a built-in self-analysis (BISA) operation, a shared BISA address issued from a shared BISA circuit includes a memory tile address. Each memory tile includes a unique fixed memory tile address that is compared to the received memory tile address of a received BISA address. If the memory tile address in the received BISA address matches the fixed memory tile address of a memory tile, the memory tile is activated to use the memory address in the BISA address to access addressed memory bit cells for analysis. Thus, if the memory system is redesigned to include additional memory tiles for increased capacity, the memory tile address size in the BISA address can be updated for addressing added memory tiles.

30 Claims, 7 Drawing Sheets

SHARED BUILT-IN SELF-ANALYSIS OF MEMORY SYSTEMS EMPLOYING A MEMORY ARRAY TILE ARCHITECTURE

BACKGROUND

I. Field of the Disclosure

The technology of the disclosure relates generally to memory systems for processor-based systems, and more particularly to built-in memory analysis circuits, such as built-in self-test (BIST) circuits, built-in redundancy analysis (BIRA) circuits, and built-in self-repair (BISR) circuits as examples, to analyze bit cells in a memory array(s) of a memory system.

II. Background

Microprocessors perform computational tasks in a wide variety of applications. A typical microprocessor application includes one or more central processing units (CPUs) that execute software instructions. The software instructions may instruct a CPU to fetch data from a location in memory, perform one or more CPU operations using the fetched data, and generate a result. The result may then be stored in memory. As non-limiting examples, this memory can be a cache local to the CPU, a shared local cache among CPUs in a CPU block, a shared cache among multiple CPU blocks, or main memory of a microprocessor.

Figure 1:
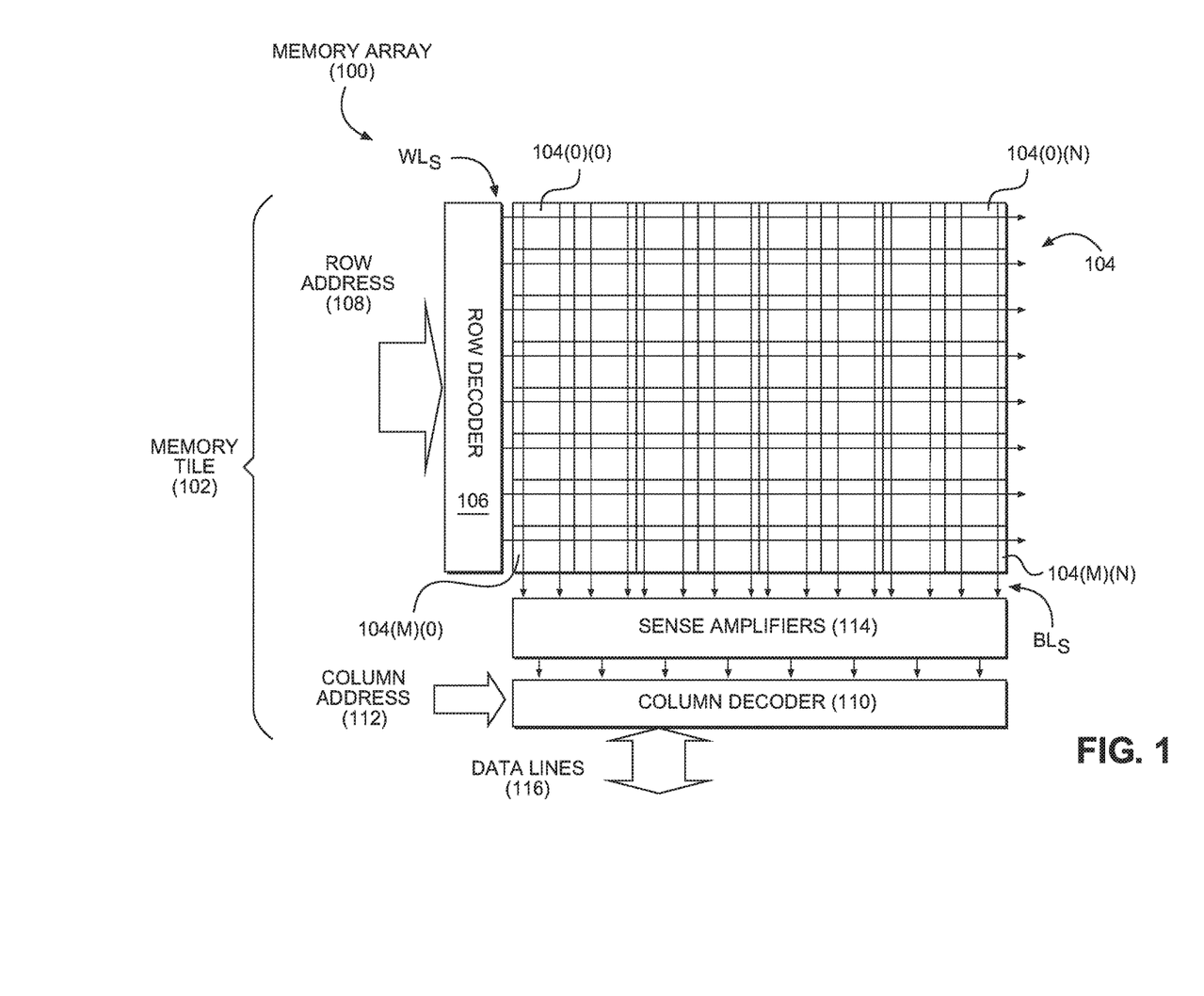
FIG. 1 is a schematic diagram of a memory array comprising an exemplary memory tile with supporting access circuitry.

In current memory system implementations, memory arrays can be provided in different memory technologies, including but not limited to static random access memory (SRAM), dynamic random access memory (DRAM), and magnetic random access memory (MRAM) as examples. The memory arrays may be organized as memory "blocks" or "tiles." A memory "tile" is a block of organized memory bit cells organized in rows and columns that are configured to be accessed for read and write operations by dedicated peripheral circuitry (e.g., row decoders, column decoders, and sense amplifiers). For example, FIG. 1 is a schematic diagram of a memory array 100 that includes a single four (4) megabyte (Mb) memory tile 102. The memory tile 102 includes a plurality of memory bit cells 104 organized in 'M' rows and 'N' columns, thus provided as memory bit cells 104(0)(0)-104(M)(N). The memory tile 102 also includes dedicated supporting circuitry to facilitate read and write operations to the memory bit cells 104. For example, the memory tile 102 includes a row decoder 106 configured to generate a word line (WL) to select a row of the memory bit cells 104 in the memory tile 102 based on a row address 108. The memory tile 102 also includes a column decoder 110 configured to select a column of the memory bit cells 104 in the memory tile 102 based on a column address 112. The memory bit cells 104 accessed are those intersecting the selected row and column by the row decoder 106 and column decoder 110. In a read operation, sense amplifiers 114 sense (i.e., read) a storage state of the selected memory bit cells 104 from their respective bit lines (BLs) to provide the read data from the selected memory bit cells 104 onto data lines 116.

Figure 2:
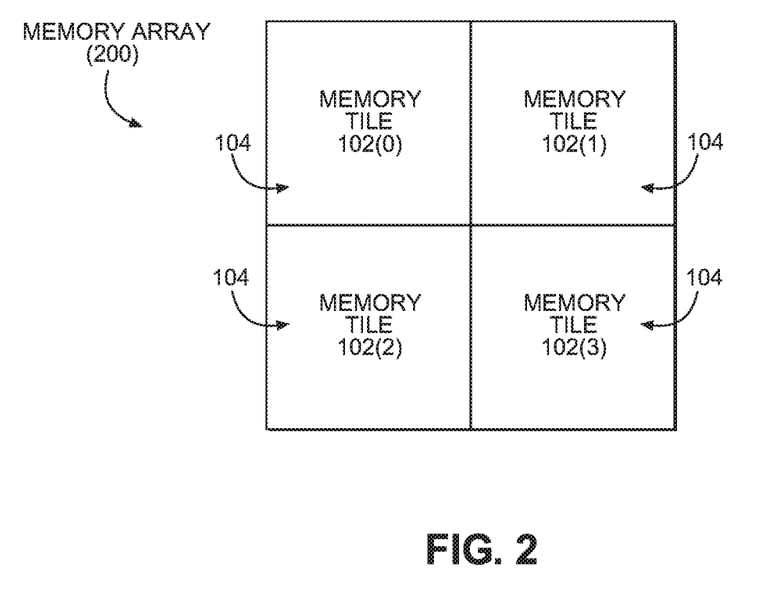
FIG. 2 is a schematic diagram of another exemplary memory array comprising a replication of four (4) of the memory tiles in FIG. 1 to create a larger sized memory array.

As memory capacity requirements increase for a memory system, additional memory storage capacity is provided in the memory array of the memory system. For example, if it is desired to provide a memory array with sixteen (16) Mb capacity, the memory tile 102 in FIG. 1 can be replicated four (4) times to provide a memory array 200 with sixteen (16) Mb capacity, as shown in FIG. 2. As shown in FIG. 2, the memory array 200 includes four (4) of the memory tiles 102 in FIG. 1, which are memory tiles 102(0)-102(3). The design of the memory tile 102 in FIG. 1 may be represented as a macro so that the memory tile 102 can be represented in a design tool during a layout process as a single component. In this regard, the macro of the memory tile 102 can be replicated to achieve the desired memory capacity without having to redesign a new memory tile to provide the memory array 200. This strategy of replicating memory tiles for increased-size memory systems can avoid new layout work and/or physical design work during the design and implementation of memory systems.

Figure 3:
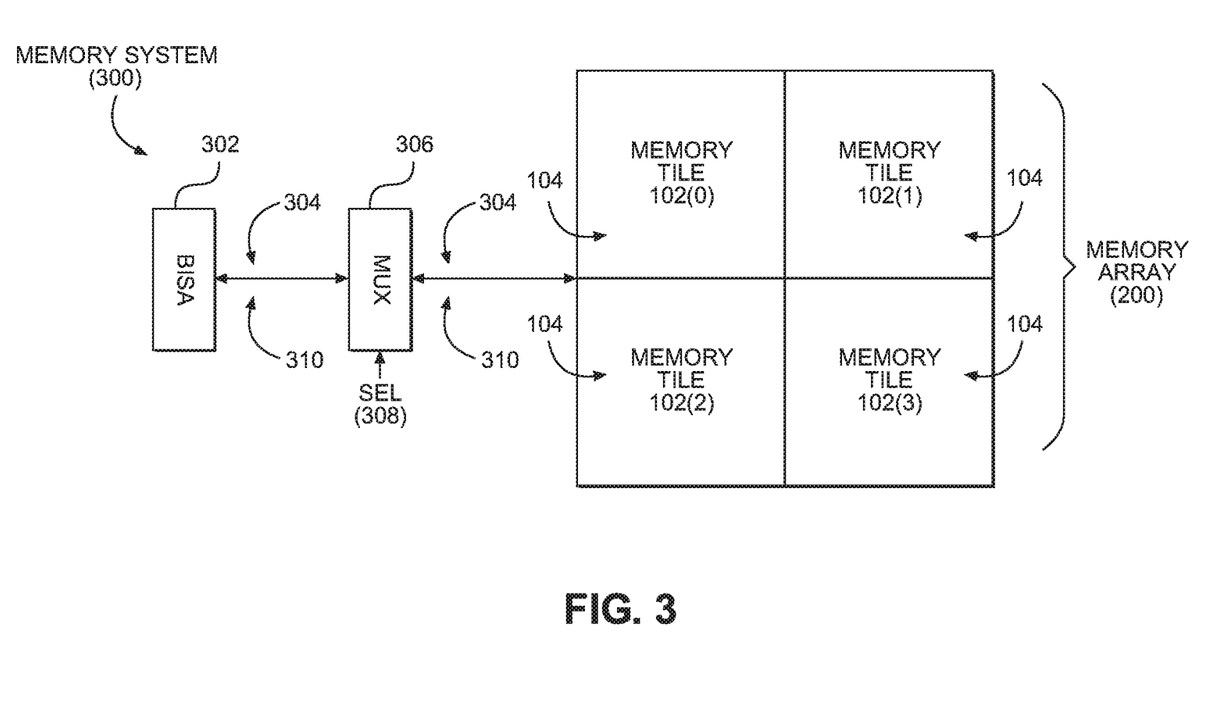
FIG. 3 is a schematic diagram of an exemplary memory system employing the memory array in FIG. 2 and a multiplexer configured to selectively re-route signals from a built-in self-analysis (BISA) circuit to a selected memory tile among a plurality of memory tiles to perform analysis of memory bit cells in the selected memory tile.

Built-in memory analysis systems, such as built-in self-test (BIST) circuits, built-in self-repair (BISR) circuits, and built-in redundancy analysis (BIRA) circuits, can also be conventionally included in memory systems to test and guarantee bit cell integrity of a memory array(s) after fabrication and manufacturing. Providing built-in memory analysis systems may be particularly important for memory types that have instabilities, such as memories employing magnetoresistive devices, such as magnetoresistive random access memories (MRAMs). Built-in memory analysis circuits are conventionally not included as part of a memory tile macro, because the built-in memory analysis circuits are considerably larger as compared to other peripheral circuits (e.g., row and column decoders, sense amplifiers) of a memory tile. Thus for example, as shown in FIG. 3, a memory system 300 can be provided that includes a single built-in self-analysis (BISA) circuit 302 configured to perform analysis of the memory tiles 102(0)-102(3) in the memory array 200. A multiplexer 306 is provided in the memory system 300 to multiplex the BISA circuit 302 to each of the memory tiles 102(0)-102(3), one at a time according to a selector signal (SEL) 308. The BISA circuit 302 may be unaware of the existence of multiple memory tiles 102(0)-102(3) in the memory array 200. The multiplexer 306 re-routes signals from the BISA circuit 302 to each memory tile 102(0)-102(3) according to the selector signal (SEL) 308. In this regard, when the BISA circuit 302 issues an address 304 for accessing memory bit cells 104, data 310 from the accessed memory bit cells 104 of the selected memory tile 102(0)-102(3) is routed back to the BISA circuit 302 for analysis. To test all the memory bit cells 104 in a given memory tile 102(0)-102(3), the BISA circuit 302 can issue addresses 304 over an address range of the memory tiles 102(0)-102(3). Because the memory tiles 102(0)-102(3) in the memory system 300 in FIG. 3 are replicated from the same memory tile macro, each of the memory tiles 102(0)-102(3) has the same address range of memory bit cells 104. Thus, the BISA circuit 302 can be activated several times, once for each memory tile 102(0)-102(3) in the memory array 200 using the same address range, to perform analysis on each memory tile 102(0)-102(3) to avoid the need to replicate the BISA circuit 302 for each memory tile 102(0)-102(3).

With continuing reference to FIG. 3, the multiplexer 306 in the memory system 300 is dependent on the number of memory tiles 102(0)-102(3) provided in the memory array 200. If it is desired to increase the memory capacity of the memory array 200, the multiplexer 306 would have to be redesigned in a new layout of the memory system 300. Further, each activation of the BISA circuit 302 for each memory tile 102(0)-102(3) incurs a certain overhead to run through the desired memory address range for analyzing the memory bit cells 104 at those addresses in the memory tiles 102(0)-102(3). For example, if the memory tiles 102(0)-102(3) are configured to store sixty-four (64) bit data words, the BISA circuit 302 must run through the address range of 0x0000 to 0xFFFF for each memory tile 102(0)-102(3) to analyze all the memory bit cells 104 in each memory tile 102(0)-102(3). Thus, it may take long periods of time to analyze all the memory bit cells 104 in each memory tile 102(0)-102(3), especially if activation and addressing of the BISA circuit 302 is controlled by a slower external interface, such as a JTAG-based serial interface.

SUMMARY OF THE DISCLOSURE

Aspects of the present disclosure involve shared built-in self-analysis of memory systems employing a memory array tile architecture. In aspects disclosed herein, the memory system includes a memory array that is comprised of a plurality of memory blocks or "tiles." A memory "tile" is a memory circuit that includes a plurality of memory bit cells and dedicated supporting circuitry to facilitate read and write operations for those memory bit cells. The memory tile can be designed according to a memory macro provided as a design component, such that the memory macro can be replicated to provide multiple memory tiles to provide the desired memory capacity in the memory system without having to redesign a new memory tile. Thus, each of the memory tiles will have a same address range. To provide built-in self-analysis of the memory bit cells in the memory tiles of the memory array, the memory system also includes a shared built-in self-analysis (BISA) circuit. The shared BISA circuit is configured to issue a shared BISA address with the memory address to be accessed to each of the memory tiles of the memory array in the same BISA operation. To selectively control which memory tile among the plurality of memory tiles is accessed for the BISA operation, the shared BISA address also includes a memory tile address. Each of the memory tiles includes a unique memory tile address that is compared to the received memory tile address as part of a received shared BISA address from the shared BISA circuit. If the memory tile address in the received shared BISA address matches the memory tile address of a memory tile, the memory tile is activated to use the memory address in the shared BISA address to access the addressed memory bit cells to provide the data stored therein to the shared BISA circuit for analysis. However, if the memory tile address in the received shared BISA address does not match the memory tile address of the memory tile, the memory tile is deactivated to prevent an access to its memory bit cells to avoid a data conflict with the activated memory tile. In this manner, as an example, if the memory system is later redesigned to replicate more memory tiles for increased capacity, the device that controls issuing the shared BISA address to the shared BISA circuit can be updated to increase the bit length of the memory tile address for addressing the added memory tiles. For example, this device may be a device that is external to the memory system and coupled through an external interface to the shared BISA circuit, and is thus more easily updated than for example, redesigning a multiplexer or other memory tile selector circuitry provided in the memory system to control access to the memory tiles and specifically designed according to the number of memory tiles provided in the memory array. In this case, such memory tile selector circuitry would have to be redesigned and/or re-laid out if the memory system capacity is increased.

In this regard, in one exemplary aspect, a memory system is provided. The memory system comprises a memory array comprising a plurality of memory tiles, each memory tile among the plurality of memory tiles comprising a plurality of memory bit cells and a unique memory tile address. The memory system also comprises a shared BISA circuit communicatively coupled to each of the plurality of memory tiles in the memory array. The shared BISA circuit is configured to issue a shared BISA address comprising a memory tile address indicating a memory tile among the plurality of memory tiles to be addressed and a memory address to be accessed in the accessed memory tile. The shared BISA circuit is also configured to receive data stored at the memory address in the memory tile at the memory tile address. Each of the plurality of memory tiles is configured to receive the shared BISA address issued by the shared BISA circuit, compare the memory tile address in the received shared BISA address to the unique memory tile address, and assert the data stored at the memory address in the received shared BISA address in response to the memory tile address in the received shared BISA address matching the unique memory tile address.

In another exemplary aspect, a memory system is provided. The memory system comprises a plurality of means for storing data, each addressable by a unique memory tile address. The memory system also comprises a means, coupled to each of the plurality of means for storing data, for analyzing data stored in each of the plurality of means for storing data. The memory system also comprises a means for issuing a shared BISA address comprising a memory tile address indicating a means for storing data among the plurality of means for storing data to be addressed and a memory address to be accessed in the means for storing data. The memory system also comprises a means for receiving data stored at the memory address in the means for storing data at the memory tile address. Each of the plurality of means for storing data comprises a means for receiving the shared BISA address issued by the means for analyzing data, and a means for comparing the memory tile address in the received shared BISA address to the unique memory tile address. The memory system also comprises a means for providing data stored at the memory address in the received shared BISA address in response to the memory tile address in the received shared BISA address matching the unique memory tile address.

In another exemplary aspect, a method of accessing data stored in a memory array to be analyzed is provided. The method comprises issuing a shared BISA address on a shared interface bus coupled to each memory tile among a plurality of memory tiles in a memory array in a memory system, the shared BISA address comprising a memory tile address indicating a memory tile among the plurality of memory tiles to be addressed and a memory address to be accessed in the memory tile. The method also comprises receiving the shared BISA address on the shared interface bus in each memory tile among the plurality of memory tiles. The method also comprises comparing the memory tile address in the received shared BISA address to a unique memory tile address in each memory tile among the plurality of memory tiles. The method also comprises asserting data on the shared interface bus stored at the memory address in the received shared BISA address for the memory tile among the plurality of memory tiles having the unique memory tile address matching the memory tile address in the received shared BISA address. The method also comprises analyzing the data on the shared interface bus.

In another exemplary aspect, a built-in memory analysis system is provided. The built-in memory analysis system comprises a built-in analysis control circuit. The built-in analysis control circuit is configured to generate a shared BISA address over a shared interface bus. The shared BISA address comprises a memory tile address indicating a memory tile among a plurality of memory tiles in a memory system to be addressed and a memory address to be accessed in the memory tile. The memory system comprises a memory array comprising the plurality of memory tiles, each memory tile among the plurality of memory tiles comprising a plurality of memory bit cells and a unique memory tile address. The memory system also comprises a shared BISA circuit communicatively coupled to each of the plurality of memory tiles in the memory array. The shared BISA circuit is configured to issue the shared BISA address comprising the memory tile address indicating the memory tile among the plurality of memory tiles to be addressed and the memory address to be accessed in the memory tile. The shared BISA circuit is also configured to receive data stored at the memory address in the memory tile at the memory tile address. Each of the plurality of memory tiles is configured to receive the shared BISA address issued by the shared BISA circuit, compare the memory tile address in the received shared BISA address to the unique memory tile address, and assert the data stored at the memory address in the received shared BISA address in response to the memory tile address in the received shared BISA address matching the unique memory tile address.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure involve shared built-in self-analysis of memory systems employing a memory array tile architecture. In aspects disclosed herein, the memory system includes a memory array that is comprised of a plurality of memory blocks or "tiles." A memory "tile" is a memory circuit that includes a plurality of memory bit cells and dedicated supporting circuitry to facilitate read and write operations for those memory bit cells. The memory tile can be designed according to a memory macro provided as a design component, such that the memory macro can be replicated to provide multiple memory tiles to provide the desired memory capacity in the memory system without having to redesign a new memory tile. Thus, each of the memory tiles will have a same address range. To provide built-in self-analysis of the memory bit cells in the memory tiles of the memory array, the memory system also includes a shared built-in self-analysis (BISA) circuit. The shared BISA circuit is configured to issue a shared BISA address with the memory address to be accessed to each of the memory tiles of the memory array in the same BISA operation. To selectively control which memory tile among the plurality of memory tiles is accessed for the BISA operation, the shared BISA address also includes a memory tile address. Each of the memory tiles includes a unique memory tile address that is compared to the received memory tile address as part of a received shared BISA address from the shared BISA circuit. If the memory tile address in the received shared BISA address matches the memory tile address of a memory tile, the memory tile is activated to use the memory address in the shared BISA address to access the addressed memory bit cells to provide the data stored therein to the shared BISA circuit for analysis. However, if the memory tile address in the received shared BISA address does not match the memory tile address of the memory tile, the memory tile is deactivated to prevent an access to its memory bit cells to avoid a data conflict with the activated memory tile. In this manner, as an example, if the memory system is later redesigned to replicate more memory tiles for increased capacity, the device that controls issuing the shared BISA address to the shared BISA circuit can be updated to increase the bit length of the memory tile address for addressing the added memory tiles. For example, this device may be a device that is external to the memory system and coupled through an external interface to the shared BISA circuit, and is thus more easily updated than for example, redesigning a multiplexer or other memory tile selector circuitry provided in the memory system to control access to the memory tiles and specifically designed according to the number of memory tiles provided in the memory array. In this case, such memory tile selector circuitry would have to be redesigned and/or re-laid out if the memory system capacity is increased.

Figure 4:
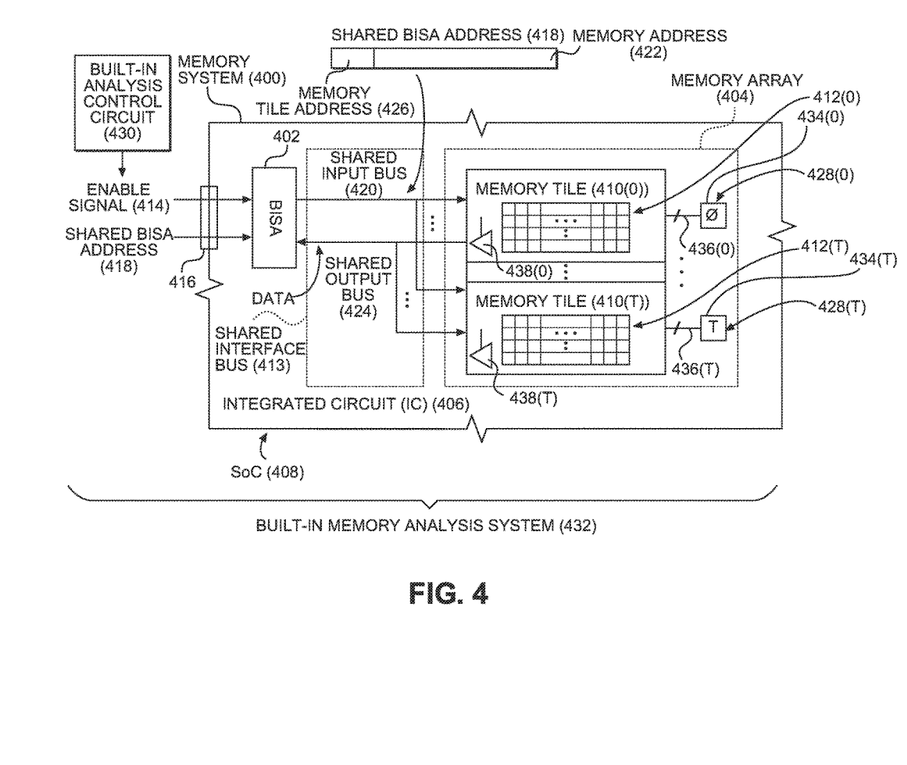
FIG. 4 is a schematic diagram of an exemplary memory system employing a shared BISA circuit configured to select a memory tile among a plurality of memory tiles in a memory array according to a memory tile address provided in a shared BISA address, wherein the shared BISA address also includes a memory address in the memory tile to be accessed and analyzed by the shared BISA circuit.

In this regard, FIG. 4 is a schematic diagram of an exemplary memory system 400 employing a shared BISA circuit 402 configured to perform analysis of memory bit cells in a memory array 404. For example, the shared BISA circuit 402 could be configured to perform a memory analysis function, such as built-in self-testing (BIST), built-in redundancy analysis (BIRA), and/or built-in self-repair (BISR) of the memory bit cells in the memory array 404. The memory system 400 can be provided in an integrated circuit (IC) 406. For example, the memory system 400 may be provided in a system-on-a-chip (SoC) 408 that includes a central processing unit (CPU) and/or other circuitry that can access the memory system 400 for storing data (DATA) and retrieving stored data (DATA), including software instructions and other data.

With continuing reference to FIG. 4, the memory array 404 in the memory system 400 is comprised of a T+1 plurality of memory tiles 410(0)-410(T). The memory tiles 410(0)-410(T) are memory circuits that each include a plurality of memory bit cells 412(0)-412(T) each configured to store data (DATA). The memory bit cells 412(0)-412(T) may be any type of bit cells, including for example, magnetoresistive random access memory (RAM) (MRAM) bit cells, static RAM (SRAM) bit cells, and dynamic RAM (DRAM) bit cells. The memory tiles 410(0)-410(T) also each include dedicated supporting circuitry (e.g., row and column decoders, sense amplifiers) to facilitate read and write operations for their respective memory bit cells 412(0)-412(T). The memory tiles 410(0)-410(T) can be designed according to a memory macro provided as a design component, such that the memory macro can be replicated to provide multiple memory tiles 410(0)-410(T) to provide the desired memory capacity in the memory system 400 without having to redesign a new memory tile. Thus, each of the memory tiles 410(0)-410(T) in this example have a same address range, because each memory tile 410(0)-410(T) is created from the same design macro. If each memory tile 410(0)-410(T) has a four (4) megabyte (Mb) capacity with sixty-four (64) bit data words, sixteen (16) bit addressing (0x0000-0xFFFF) can be used to access all data (DATA) stored in each memory tile 410(0)-410(T).

With continuing reference to FIG. 4, the BISA circuit 402 is communicatively coupled to each memory tile 410(0)-410(T) in the memory array 404 through a shared interface bus 413 so that each memory bit cell 412(0)-412(T) in the memory tiles 410(0)-410(T) can be accessed for built-in analysis as part of a BISA operation. When it is desired to perform a BISA operation to perform an analysis of memory bit cells 412(0)-412(T) in a memory tile 410(0)-410(T) in the memory array 404, the BISA circuit 402 is enabled or triggered. For example, the BISA circuit 402 may be enabled in response to an enable signal 414 received over an external input interface 416 being in an enable state. For example, the external input interface 416 may be a JTAG serial interface such that an external device can control the BISA circuit 402 to perform built-in analysis of the memory bit cells 412(0)-412(T) in a respective memory tile 410(0)-410(T). The shared BISA circuit 402 is configured to issue a shared BISA address 418 on a shared input bus 420 to be received by each of the memory tiles 410(0)-410(T) when it is desired to perform built-in analysis of data (DATA) stored in respective memory bit cells 412(0)-412(T). In this regard, the shared BISA address 418 contains a memory address 422 of the memory location in an accessed memory tile 410(0)-410(T) to be accessed. The shared input bus 420 is shared between all the memory tiles 410(0)-410(T) so that the shared BISA address 418 is provided to all the memory tiles 410(0)-410(T) for a BISA operation to, for example, avoid the need to provide a separate routing or selector circuit to control the routing of the shared BISA address 418 to a particular memory tile 410(0)-410(T). The accessed data (DATA) at the memory address 422 is asserted on a shared output bus 424, which can again, for example, avoid the need for a routing or selector circuit to be provided to the BISA circuit 402 for built-in analysis for a BISA operation. However, it is desired to be able to individually access the memory address 422 in the memory tiles 410(0)-410(T) without each memory tile 410(0)-410(T) asserting read data (DATA) at the memory address 422 on the shared output bus 424 at the same time, which could cause data collisions.

Thus, to selectively control which memory tile 410(0)-410(T) among the memory tiles 410(0)-410(T) is accessed for the BISA operation, the shared BISA address 418 also includes a memory tile address 426. The memory tile address 426 indicates which memory tile 410(0)-410(T) among the memory tiles 410(0)-410(T) is to be accessed to obtain data (DATA) at the memory address 422 for performing the BISA operation. The memory tile address 426 may be additional bits that are appended to the memory address 422 in the shared BISA address 418. For example, the memory tile address 426 may be one or more bits provided as the most significant bit(s) (MSB) or the least significant bit(s) (LSB) in the shared BISA address 418. Each of the memory tiles 410(0)-410(T) includes a unique memory tile address 428(0)-428(T) that is different from the memory tile address 428(0)-428(T) of the other memory tiles 410(0)-410(T). For example, if the memory array 404 includes two (2) memory tiles 410(0)-410(T), where 'T'=1, only one (1) bit is needed for the memory tile address 426 to uniquely address each memory tile 410(0)-410(T). As another example, if the memory array 404 includes sixteen (16) memory tiles 410(0)-410(T), where 'T'=15, at least four (4) bits is needed for the memory tile address 426 to uniquely address each memory tile 410(0)-410(T). Each memory tile 410(0)-410(T) is configured to compare the received memory tile address 426 as part of a received shared BISA address 418 on the shared input bus 420 from the shared BISA circuit 402. If the memory tile address 426 in the received shared BISA address 418 matches the memory tile address 428(0)-428(T) of a respective memory tile 410(0)-410(T), such memory tile 410(0)-410(T) is activated to use the received memory address 422 in the shared BISA address 418 to access the respective memory bit cells 412(0)-412(T) at the memory address 422 to assert the data (DATA) stored therein on the shared output bus 424 to be provided to the shared BISA circuit 402 for analysis. Only one memory tile address 428(0)-428(T) of a memory tile 410(0)-410(T) should match the received memory tile address 426 in this example, because the memory tile address 428(0)-428(T) of a memory tile 410(0)-410(T) is configured to be unique to each other. However, if the memory tile address 426 in the received shared BISA address 418 does not match the memory tile address 428(0)-428(T) of a respective memory tile 410(0)-410(T), the memory tile 410(0)-410(T) is deactivated to prevent the memory tile 410(0)-410(T) from asserting data (DATA) on the shared output bus 424 to avoid a data conflict with the activated memory tile 410(0)-410(T).

In this manner, as an example, if the memory system 400 in FIG. 4 is later redesigned to replicate more memory tiles 410(0)-410(T) for increased capacity, the device that controls issuing the shared BISA address 418 to the shared BISA circuit 402 can be updated to increase the bit length of the memory tile address 426 for addressing the added memory tile 410(0)-410(T). For example, the shared BISA address 418 may be provided to the shared BISA circuit 402 over the external input interface 416 by a separate built-in analysis control circuit 430. The built-in analysis control circuit 430 and the memory system 400 may be included in a built-in memory analysis system 432. The built-in analysis control circuit 430 may be a device that is external to the memory system 400 and coupled through the external input interface 416 to the shared BISA circuit 402. The built-in analysis control circuit 430 may be more easily updated than for example, redesigning a multiplexer or other memory tile selector circuitry provided in the memory system 400 to control access to the memory tiles 410(0)-410(T) and specifically designed according to the number of memory tiles 410(0)-410(T) provided in the memory array 404. If a separate memory tile selector circuitry, such as a multiplexor, were provided to route a memory address from the shared BISA circuit 402, the separate memory tile selector circuitry would have to be redesigned and/or re-laid out if the memory system 400 capacity is increased. Alternatively, the shared BISA address 418 may be generated within the BISA circuit 402 based on a predetermined built-in memory address analysis scheme.

With continuing reference to FIG. 4, the memory tile addresses 428(0)-428(T) in this example are provided by respective memory tile address circuits 434(0)-434(T) provided for each memory tile 410(0)-410(T). The memory tile address circuits 434(0)-434(T) can be provided as part of the memory tiles 410(0)-410(T), or separate from and accessible by the memory tiles 410(0)-410(T). In this example, each memory tile address circuit 434(0)-434(T) includes one or more memory tile address interfaces 436(0)-436(T) each configured to be coupled to signals of different signal levels to create a logic low state (e.g., '0') or logic high state (e.g., '1'). For example, a memory tile address interface 436(0)-436(T) may be coupled to a ground voltage to represent a logic low state, and a supply voltage to represent a logic high state. The signals on the memory tile address interfaces 436(0)-436(T) being logic low or logic high states can represent bits of the respective memory tile address 428(0)-428(T) to uniquely identify the memory tiles 410(0)-410(T).

Further, in this example, each memory tile 410(0)-410(T) includes a data output circuit 438(0)-438(T) configured to control the assertion or non-assertion of data (DATA) accessed from the memory bit cells 412(0)-412(T) in a respective memory tile 410(0)-410(T) in response to receipt of the shared BISA address 418. For example, in the memory system 400 in FIG. 4, the memory tiles 410(0)-410(T) are each configured to receive the shared BISA address 418 and to access the respective memory bit cells 412(0)-412(T) at the memory address 422. However, if the memory tile address 426 does not match the memory tile address 428(0)-428(T) of a given memory tile 410(0)-410(T), the data output circuit 438(0)-438(T) is configured to prevent data (DATA) from the accessed memory bit cells 412(0)-412(T) in the respective memory tile 410(0)-410(T) from being asserted on the shared output bus 424. For example, the data output circuit 438(0)-438(T) may be an OR-based gate coupled to a data output from the memory tile 410(0)-410(T) and an input indicative of the memory tile address 428(0)-428(T) matching the memory tile address 426 from the shared BISA address 418. The data output circuits 438(0)-438(T) could be configured to present a high impedance to the shared output bus 424 in response to the memory tile address 428(0)-428(T) not matching the memory tile address 426 from the shared BISA address 418 to prevent data (DATA) accessed at the memory address 422 in the respective memory tile 410(0)-410(T) from being asserted on the shared output bus 424. On the other hand, the data output circuits 438(0)-438(T) could be configured to present a low impedance to the shared output bus 424 in response to the memory tile address 428(0)-428(T) matching the memory tile address 426 from the shared BISA address 418 to assert the data (DATA) accessed at the memory address 422 in the respective memory tile 410(0)-410(T) on the shared output bus 424.

Figure 5:
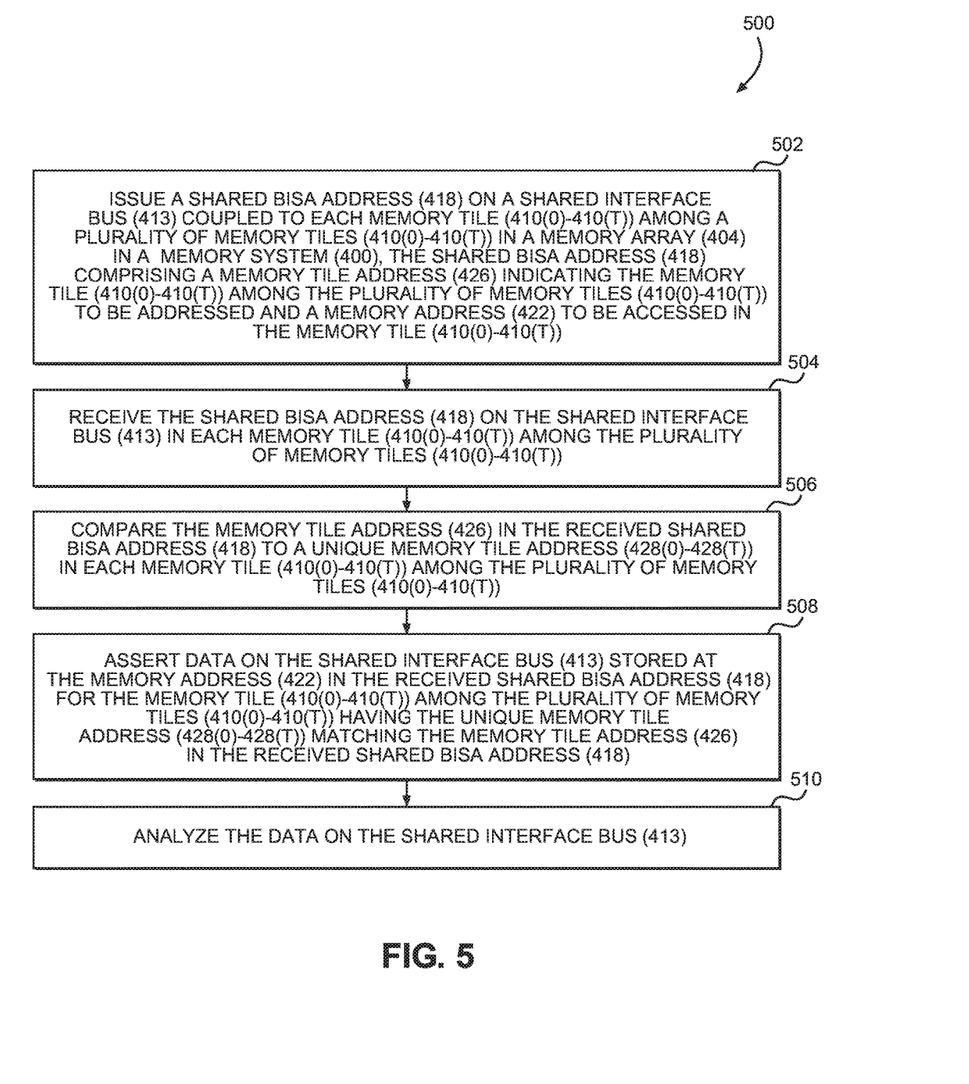
FIG. 5 is a flowchart illustrating an exemplary process of the shared BISA circuit in the memory system in FIG. 4 issuing a shared BISA address to the memory tile in the memory array, wherein a memory tile address in the shared BISA address indicates the memory tile among the plurality of memory tiles to be accessed according to the memory address in the shared BISA address.

FIG. 5 is a flowchart illustrating an exemplary process 500 of the shared BISA circuit 402 in the memory system 400 in FIG. 4 issuing the shared BISA address 418 to the memory tiles 410(0)-410(T) in the memory array 404, wherein a memory tile address 426 in the shared BISA address 418 indicates the memory tile 410(0)-410(T) to be accessed for performing a BISA operation. In this regard, the process 500 includes the shared BISA circuit 402 issuing the shared BISA address 418 on the shared interface bus 413 (block 502). The shared interface bus 413 is coupled to each memory tile 410(0)-410(T) in the memory array 404 in the memory system 400. The shared BISA address 418 comprises the memory tile address 426 indicating the memory tile 410(0)-410(T) among the plurality of memory tiles 410(0)-410(T) to be addressed and the memory address 422 to be accessed in the memory tile 410(0)-410(T). Each memory tile 410(0)-410(T) receives the shared BISA address 418 on the shared interface bus 413 (block 504). Each memory tile 410(0)-410(T) compares the memory tile address 426 in the received shared BISA address 418 to its respective unique memory tile address 428(0)-428(T) (block 506). If the memory tile address 426 in the received shared BISA address 418 matches a respective memory tile address 428(0)-428(T) in a memory tile 410(0)-410(T), that memory tile 410(0)-410(T) asserting data (DATA) on the shared interface bus 413 is stored in such memory tile 410(0)-410(T) at the memory address 422 in the received shared BISA address 418 (block 508). The shared BISA circuit 402 can then analyze the received data (DATA) on the shared interface bus 413 as part of a BISA operation (block 510).

Figure 6:
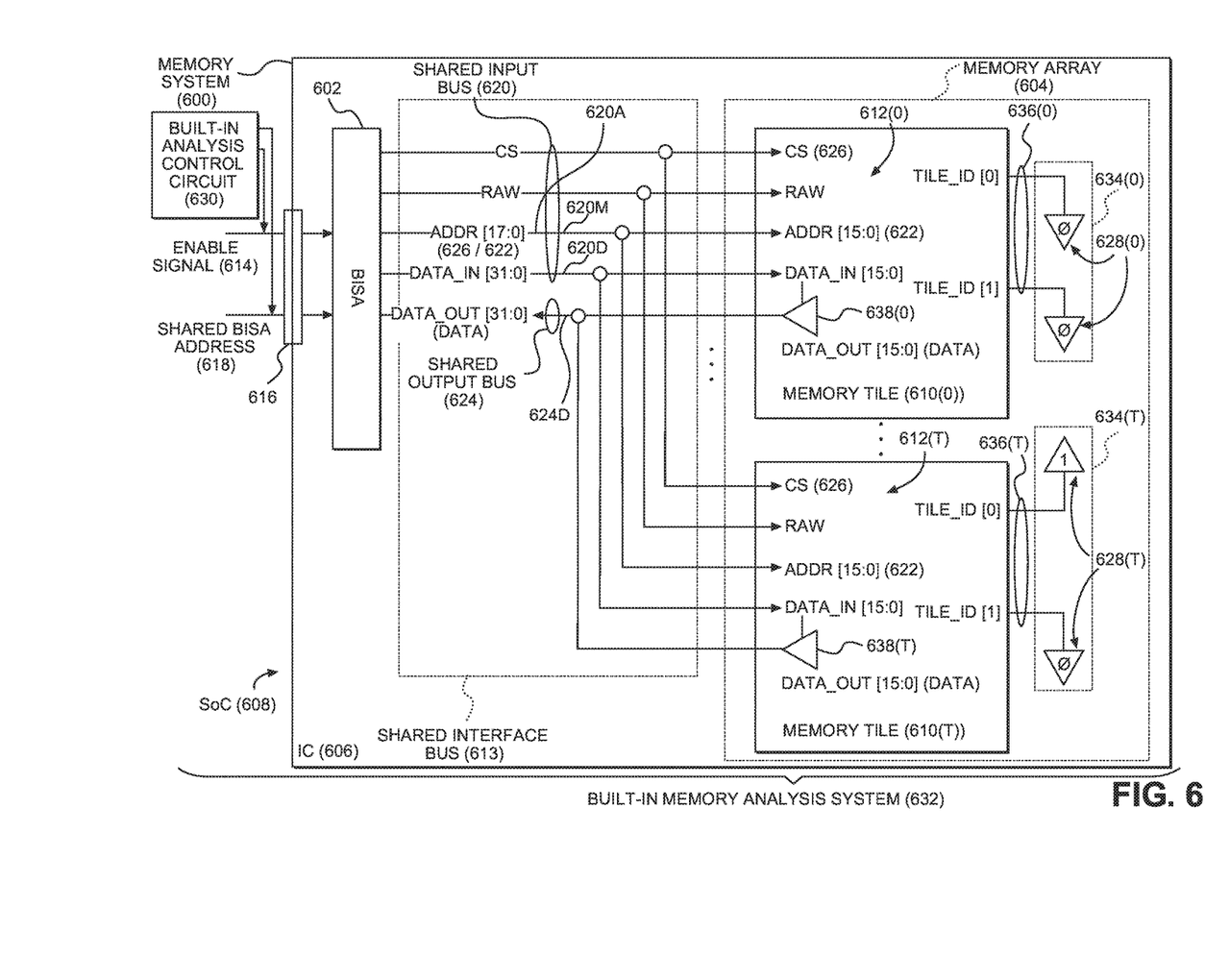
FIG. 6 is a schematic diagram of another exemplary memory system employing a shared BISA circuit configured to select a memory tile among a plurality of memory tiles in a memory array according to a memory tile address provided in a shared BISA address, wherein the shared BISA address also includes a memory address in the memory tile to be accessed and analyzed by the shared BISA circuit.

FIG. 6 is a schematic diagram of an exemplary memory system 600 employing a shared BISA circuit 602 configured to perform analysis of memory bit cells in a memory array 604. For example, the shared BISA circuit 602 could be configured to perform memory analysis functions, such as built-in self-testing (BIST), built-in redundancy analysis (BIRA), and/or built-in self-repair (BISR) of the memory bit cells in the memory array 604. The memory system 600 can be provided in an IC 606. For example, the memory system 600 may be provided in a SoC 608 that includes a CPU and/or other circuitry that can access the memory system 600 for storing data (DATA) and retrieving stored data (DATA), including software instructions and other data.

With continuing reference to FIG. 6, the memory array 604 in the memory system 600 is comprised of a T+1 plurality of memory tiles 610(0)-610(T). The memory tiles 610(0)-610(T) are memory circuits that each include a plurality of memory bit cells 612(0)-612(T) each configured to store data (DATA). The memory bit cells 612(0)-612(T) may be any type of bit cells, including for example, MRAM bit cells, SRAM bit cells, and DRAM bit cells. The memory tiles 610(0)-610(T) also each include dedicated supporting circuitry (e.g., row and column decoders, sense amplifiers) to facilitate read and write operations for their respective memory bit cells 612(0)-612(T). The memory tiles 610(0)-610(T) can be designed according to a memory macro provided as a design component, such that the memory macro can be replicated to provide multiple memory tiles 610(0)-610(T) to provide the desired memory capacity in the memory system 600 without having to redesign a new memory tile. Thus, each of the memory tiles 610(0)-610(T) in this example has a same address range, because each memory tile 610(0)-610(T) is created from the same design macro. If each memory tile 610(0)-610(T) has a sixteen (16) megabyte (Mb) capacity with sixty-four (64) bit data words, twenty (20) bit addressing (0x00000-0xFFFFF) can be used to access all data (DATA) stored in each memory tile 610(0)-610(T).

With continuing reference to FIG. 6, the BISA circuit 602 is communicatively coupled to each memory tile 610(0)-610(T) in the memory array 604 through a shared interface bus 613 so that each memory bit cell 612(0)-612(T) in the memory tiles 610(0)-610(T) can be accessed for built-in analysis as part of a BISA operation. When it is desired to perform a BISA operation to perform an analysis of memory bit cells 612(0)-612(T) in a memory tile 610(0)-610(T) in the memory array 604, the BISA circuit 602 is enabled or triggered. For example, the BISA circuit 602 may be enabled in response to an enable signal 614 received over an external input interface 616 being in an enable state. For example, the external input interface 616 may be a JTAG serial interface such that an external device can control the BISA circuit 602 to perform built-in analysis of the memory bit cells 612(0)-612(T) in a respective memory tile 610(0)-610(T). The shared BISA circuit 602 is configured to issue a shared BISA address 618 on a shared input bus 620 to be received by each of the memory tiles 610(0)-610(T) when it is desired to perform built-in analysis of data (DATA) stored in respective memory bit cells 612(0)-612(T). In this regard, the shared BISA address 618 contains a memory address 622 of the memory location in an accessed memory tile 610(0)-610(T) to be accessed. In this example, the shared input bus 620 contains a shared memory address bus 620M coupled to and shared between all the memory tiles 610(0)-610(T). The shared memory address bus 620M carries the memory address 622 to be provided to all the memory tiles 610(0)-610(T) for a BISA operation. For example, this can avoid the need to provide a separate routing or selector circuit to control the routing of the shared BISA address 618 to a particular memory tile 610(0)-610(T). The shared input bus 620 also includes a shared input data bus 620D (DATA_IN [31:0] in this example) to carry data (DATA) from the shared BISA circuit 602 to be written into a selected memory tile 610(0)-610(T) at the memory address 622 asserted on a shared memory tile selection bus 620A as part of the shared BISA address 618.

With continuing reference to FIG. 6, the accessed data (DATA) at the memory address 622 is asserted on a shared output bus 624. In this example, the shared output bus 624 includes a shared output data bus 624D (DATA_OUT [31:0] in this example) configured to carry the data (DATA) asserted by a memory tile 610(0)-610(T) to the shared BISA circuit 602. Again, for example, the shared output data bus 624D can avoid the need for a routing or selector circuit to be provided to the BISA circuit 602 for built-in analysis for a BISA operation. However, it is desired to be able to individually access the memory address 622 in the memory tiles 610(0)-610(T) without each memory tile 610(0)-610(T) asserting read data (DATA) at the memory address 622 on the shared output bus 624 at the same time, which could cause data collisions.

Thus, to selectively control which memory tile 610(0)-610(T) among the memory tiles 610(0)-610(T) is accessed for the BISA operation, the shared BISA address 618 also includes a memory tile address 626. A chip select signal (CS) is asserted to each of the memory tiles 610(0)-610(T) in this example to activate the memory tiles 610(0)-610(T). The shared BISA address 618 is asserted by the shared BISA circuit 602 on the shared memory tile selection bus 620A as part of the memory address 622. The shared memory tile selection bus 620A is part of the shared input bus 620. The memory tile address 626 indicates which memory tile 610(0)-610(T) among the memory tiles 610(0)-610(T) is to be accessed to obtain data (DATA) at the memory address 622 for performing the BISA operation. The memory tile address 626 may be additional bits that are appended to the memory address 622 in the shared BISA address 618. For example, the memory tile address 626 may be one (1) or more bits provided as the most significant bit(s) (MSB(s)) or the least significant bit(s) (LSB(s)) in the shared BISA address 618. In this example, the shared memory tile selection bus 620A has an eighteen (18) bit width shown as ADDR [17:0] in FIG. 6, because the memory address 622 is sixteen (16) bits and the memory tile address 626 is two (2) bits to address four (4) memory tiles 610(0)-610(T), wherein 'T'=3. The memory tile address 626 may be located in any bit locations, including the MSB(s) or LSB(s) asserted on the shared memory tile selection bus 620A.

With continuing reference to FIG. 6, each of the memory tiles 610(0)-610(T) includes a unique memory tile address 628(0)-628(T) that is different from the memory tile address 628(0)-628(T) of the other memory tiles 610(0)-610(T). For example, if the memory array 604 includes four (4) memory tiles 610(0)-610(T), where 'T'=3, at least two (2) bits is needed for the memory tile address 626 to uniquely address each memory tile 610(0)-610(T). Each memory tile 610(0)-610(T) is configured to compare the received memory tile address 626 as part of the received shared BISA address 618 on the shared memory tile selection bus 620A from the shared BISA circuit 602. If the memory tile address 626 in the received shared BISA address 618 matches the memory tile address 628(0)-628(T) of a respective memory tile 610(0)-610(T), such memory tile 610(0)-610(T) is activated to use the received memory address 622 in the shared BISA address 618 to access the respective memory bit cells 612(0)-612(T) at the memory address 622 to assert the data (DATA) stored therein on the shared output data bus 624D to be provided to the shared BISA circuit 602 for analysis. Only one memory tile address 628(0)-628(T) of a memory tile 610(0)-610(T) should match the received memory tile address 626 in this example, because the memory tile address 628(0)-628(T) of a memory tile 610(0)-610(T) is configured to be unique to each other. However, if the memory tile address 626 in the received shared BISA address 618 does not match the memory tile address 628(0)-628(T) of a respective memory tile 610(0)-610(T), the memory tile 610(0)-610(T) is deactivated to prevent the memory tile 610(0)-610(T) from asserting data (DATA) on the shared output data bus 624D to avoid a data conflict with the activated memory tile 610(0)-610(T).

In this manner, as an example, if the memory system 600 in FIG. 6 is later redesigned to replicate more memory tiles 610(0)-610(T) for increased capacity, the device that controls issuing the shared BISA address 618 to the shared BISA circuit 602 can be updated to increase the bit length of the memory tile address 626 for addressing the added memory tile 610(0)-610(T). For example, the shared BISA address 618 may be provided to the shared BISA circuit 602 over the external input interface 616 by a separate built-in analysis control circuit 630. The built-in analysis control circuit 630 and the memory system 600 may be included in a built-in memory analysis system 632. The built-in analysis control circuit 630 may be a device that is external to the memory system 600 and coupled through the external input interface 616 to the shared BISA circuit 602. The built-in analysis control circuit 630 may be more easily updated than for example, redesigning a multiplexer or other memory tile selector circuitry provided in the memory system 600 to control access to the memory tiles 610(0)-610(T) and specifically designed according to the number of memory tiles 610(0)-610(T) provided in the memory array 604. If a separate memory tile selector circuitry, such as a multiplexor, were provided to route a memory address from the shared BISA circuit 602, the separate memory tile selector circuitry would have to be redesigned and/or re-laid out if the memory system 600 capacity is increased. Alternatively, the shared BISA address 618 may be generated within the BISA circuit 602 based on a predetermined built-in memory address analysis scheme.

With continuing reference to FIG. 6, the memory tile addresses 628(0)-628(T) in this example are provided by respective memory tile address circuits 634(0)-634(T) provided for each memory tile 610(0)-610(T). The memory tile address circuits 634(0)-634(T) can be provided as part of the memory tiles 610(0)-610(T), or separate from and accessible by the memory tiles 610(0)-610(T). In this example, each memory tile address circuit 634(0)-634(T) includes one or more memory tile address interfaces 636(0)-636(T) each configured to be coupled to signals of different signal levels to create a logic low state (e.g., '0') or logic high state (e.g., '1'). For example, a memory tile address interface 636(0)-636(T) may be coupled to a ground voltage to represent a logic low state, and a supply voltage to represent a logic high state. The signals on the memory tile address interfaces 636(0)-636(T) being logic low or logic high states can represent bits of the respective memory tile addresses 628(0)-628(T) to uniquely identify the memory tiles 610(0)-610(T). As shown in FIG. 6, in this example, the memory tile address circuits 634(0)-634(T) each can store two (2) states. Memory tile address circuit 634(0) is represented by two (2) logic low states (i.e., 00) in two (2) bits as a memory tile address 628(0) (TILE_ID[1]-TILE_ID[0]). Memory tile address circuit 634(T) is represented by high and low logic states (i.e., 10) in two (2) bits as a memory tile address 628(T) (TILE_ID[1]-TILE_ID[0]).

Further, in this example, each memory tile 610(0)-610(T) includes a data output circuit 638(0)-638(T) configured to control the assertion or non-assertion of data (DATA) accessed from the memory bit cells 612(0)-612(T) in a respective memory tile 610(0)-610(T) in response to receipt of the shared BISA address 618. For example, in the memory system 600 in FIG. 6, the memory tiles 610(0)-610(T) are each configured to receive the shared BISA address 618 and to access the respective shared BISA address 618. However, if the memory tile address 626 does not match the memory tile address 628(0)-628(T) of a given memory tile 610(0)-610(T), the data output circuit 638(0)-638(T) is configured to prevent data (DATA) from the accessed memory bit cells 612(0)-612(T) in the respective memory tile 610(0)-610(T) from being asserted on the shared output data bus 624D. For example, the data output circuit 638(0)-638(T) may be an OR-based gate coupled to a data output from the memory tile 610(0)-610(T) and an input indicative of the memory tile address 628(0)-628(T) matching the memory tile address 626 from the shared BISA address 618. The data output circuits 638(0)-638(T) could be configured to present a high impedance to the shared output data bus 624D in response to the memory tile address 628(0)-628(T) not matching the memory tile address 626 from the shared BISA address 618 to prevent data (DATA) accessed at the memory address 622 in the respective memory tile 610(0)-610(T) from being asserted on the shared output data bus 624D. On the other hand, the data output circuits 638(0)-638(T) could be configured to present a low impedance to the shared output data bus 624D in response to the memory tile address 628(0)-628(T) matching the memory tile address 626 from the shared BISA address 618 to assert the data (DATA) accessed at the memory address 622 in the respective memory tile 610(0)-610(T) on the shared output data bus 624D.

Other exemplary memory systems can be provided that include a shared BISA circuit configured to perform analysis of memory bit cells in a memory array. In this regard, a memory system can be provided that includes a plurality of means for storing data, each addressable by a unique memory tile address. For example, the means for storing data could be a memory array including memory tiles, as examples. The memory system also comprises a means, coupled to each of the plurality of means for storing data, for analyzing data stored in each of the plurality of means for storing data. The means for analyzing data could be a BISA circuit, including but not limited to a BIST circuit, a BIRA circuit, and/or a BISR circuit, as examples. The memory system also comprises a means for issuing a shared BISA address comprising a memory tile address indicating a means for storing data among the plurality of means for storing data to be addressed and a memory address to be accessed in the means for storing data. The means for issuing a shared BISA address could also be a BISA circuit, including but not limited to a BIST circuit, a BIRA circuit, and/or a BISR circuit, as examples. The memory system also comprises a means for receiving data stored at the memory address in the means for storing data at the memory tile address. The means for receiving data stored at the memory address could also be a BISA circuit, including but not limited to a BIST circuit, a BIRA circuit, and/or a BISR circuit, as examples. Each of the plurality of means for storing data comprises a means for receiving the shared BISA address issued by the means for analyzing data, and a means for comparing the memory tile address in the received shared BISA address to the unique memory tile address. The memory system also comprises a means for providing data stored at the memory address in the received shared BISA address in response to the memory tile address in the received shared BISA address matching the unique memory tile address. The means for providing data could be a memory array or memory tile in a memory array as examples.

Memory systems employing a shared BISA circuit configured to select a memory tile among a plurality of memory tiles in a memory array according to a memory tile address provided in a shared BISA address, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
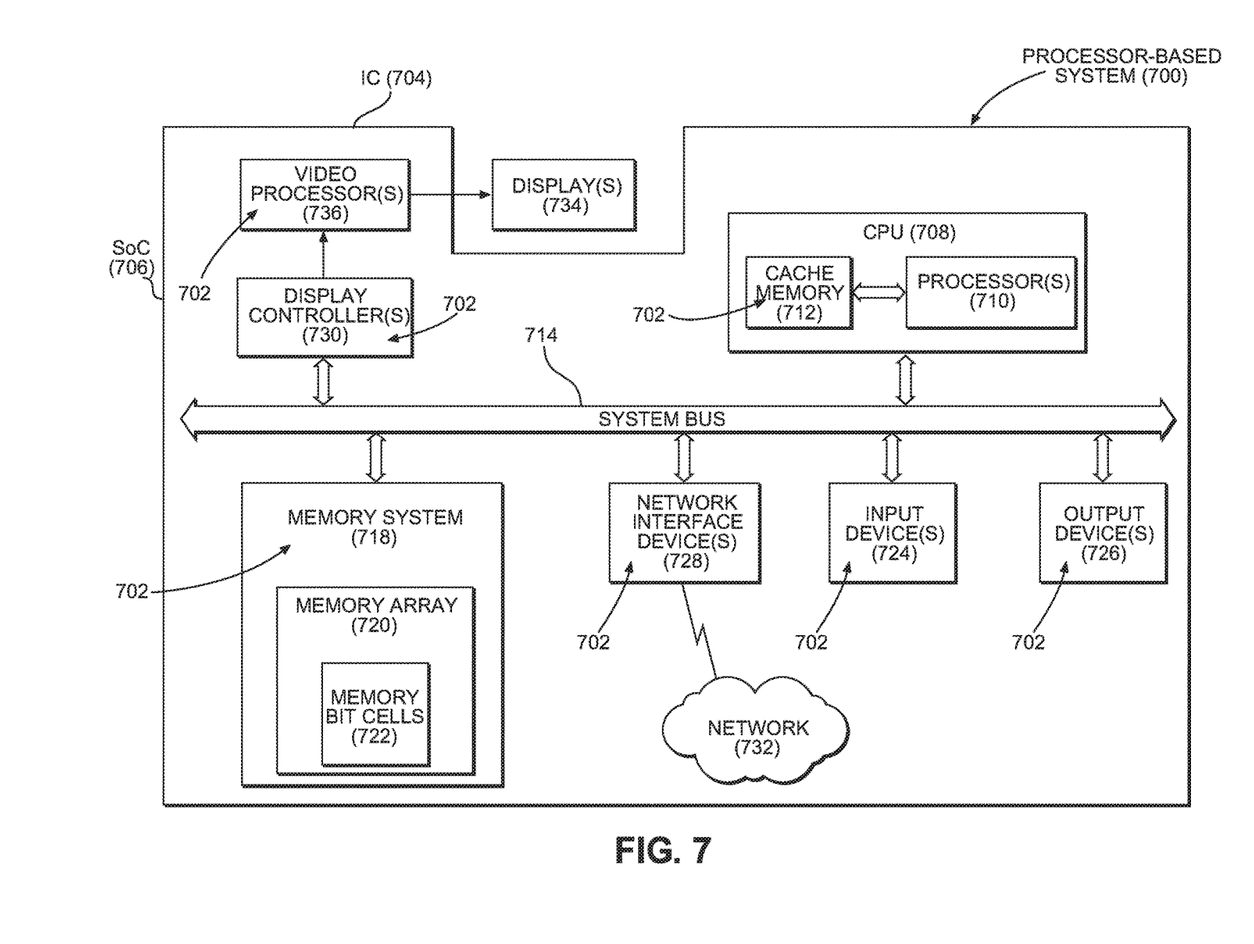
FIG. 7 is a block diagram of an exemplary processor-based system that can include one or more memory systems employing a shared BISA circuit configured to select a memory tile among a plurality of memory tiles in a memory array according to a memory tile address provided in a shared BISA address, including but not limited to the memory systems in FIGS. 4 and 6.

In this regard, FIG. 7 illustrates an example of a processor-based system 700 that can include one or more memory systems 702 employing a shared BISA circuit configured to select a memory tile among a plurality of memory tiles in a memory array according to a memory tile address provided in a shared BISA address. These memory systems 702 can include the memory systems 400, 600 in FIGS. 4 and 6, respectively, as non-limiting examples.

In this example, the processor-based system 700 is provided in an IC 704. The IC 704 may be included in or provided as a SoC 706. The processor-based system 700 includes a CPU 708 that includes one or more processors 710. The CPU 708 may have a cache memory 712 coupled to the processor(s) 710 for rapid access to temporarily stored data. The cache memory 712 may include a memory system 702 employing a shared BISA circuit configured to select a memory tile among a plurality of memory tiles in a memory array according to a memory tile address provided in a shared BISA address. The CPU 708 is coupled to a system bus 714 and can intercouple master and slave devices included in the processor-based system 700. As is well known, the CPU 708 communicates with these other devices by exchanging address, control, and data information over the system bus 714. Although not illustrated in FIG. 7, multiple system buses 714 could be provided, wherein each system bus 714 constitutes a different fabric. For example, the CPU 708 can communicate bus transaction requests to a memory system 718 as an example of a slave device. The memory system 718 may include a memory array 720 that includes memory bit cells 722. The memory system 718 may be a memory system 702 employing a shared BISA circuit configured to select a memory tile among a plurality of memory tiles in a memory array according to a memory tile address provided in a shared BISA address.

Other master and slave devices can be connected to the system bus 714. As illustrated in FIG. 7, these devices can include the memory system 718, and one or more input devices 724, which can include a memory system 702 employing a shared BISA circuit configured to select a memory tile among a plurality of memory tiles in a memory array according to a memory tile address provided in a shared BISA address. The input device(s) 724 can include any type of input device, including but not limited to input keys, switches, voice processors, etc. The other devices can also include one or more output devices 726, and one or more network interface devices 728, both of which can include memory systems 702 employing a shared BISA circuit configured to select a memory tile among a plurality of memory tiles in a memory array according to a memory tile address provided in a shared BISA address. The output device(s) 726 can include any type of output device, including but not limited to audio, video, other visual indicators, etc. The other devices can also include one or more display controllers 730 as examples. The network interface device(s) 728 can be any devices configured to allow exchange of data to and from a network 732. The network 732 can be any type of network, including but not limited to a wired or wireless network, a private or public network, a local area network (LAN), a wireless local area network (WLAN), a wide area network (WAN), a BLUETOOTH™ network, and the Internet. The network interface device(s) 728 can be configured to support any type of communications protocol desired.

The CPU 708 may also be configured to access the display controller(s) 730 over the system bus 714 to control information sent to one or more displays 734. The display controller(s) 730 sends information to the display(s) 734 to be displayed via one or more video processors 736, which process the information to be displayed into a format suitable for the display(s) 734. The display controller(s) 730 and the video processor(s) 736 can include memory systems 702 employing a shared BISA circuit configured to select a memory tile among a plurality of memory tiles in a memory array according to a memory tile address provided in a shared BISA address. The display(s) 734 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory system, comprising:
   a memory array comprising a plurality of memory tiles, each memory tile among the plurality of memory tiles comprising a plurality of memory bit cells and a unique memory tile address; and
   a shared built-in self-analysis (BISA) circuit communicatively coupled to each of the plurality of memory tiles in the memory array;
   wherein the shared BISA circuit configured to:
      issue a shared BISA address comprising a memory tile address indicating a memory tile among the plurality of memory tiles to be addressed and a memory address to be accessed in the accessed memory tile; and
      receive data stored at the memory address in the memory tile at the memory tile address; and
   wherein each of the plurality of memory tiles configured to:
      receive the shared BISA address issued by the shared BISA circuit;
      compare the memory tile address in the received shared BISA address to the unique memory tile address; and
      assert the data stored at the memory address in the received shared BISA address in response to the memory tile address in the received shared BISA address matching the unique memory tile address.

2. The memory system of claim 1, wherein each of the plurality of memory tiles is further configured to not assert the data stored at the memory address in the received shared BISA address in response to the memory tile address in the received shared BISA address not matching the unique memory tile address.

3. The memory system of claim 1, wherein the shared BISA circuit is further configured to receive the shared BISA address over an external input interface coupled to the shared BISA circuit.

4. The memory system of claim 1, wherein the shared BISA circuit is further configured to receive an enable signal, the shared BISA circuit configured to issue the shared BISA address in response to the enable signal indicating an enable state.

5. The memory system of claim 1, wherein the memory tile address comprises at least one most significant bit of the shared BISA address.

6. The memory system of claim 1, wherein each of the plurality of memory tiles comprises a same address range.

7. The memory system of claim 1, wherein each memory tile among the plurality of memory tiles comprises a memory tile address circuit configured to provide the unique memory tile address for the memory tile.

8. The memory system of claim 7, wherein the memory tile address circuit comprises at least one memory tile address interface configured to be coupled to a supply voltage or a ground voltage, wherein signal levels on the at least one memory tile address are configured to provide the memory tile address for the respective memory tile.

9. The memory system of claim 1, wherein each of the plurality of memory tiles comprises a plurality of magnetoresistive random access memory (MRAM) bit cells.

10. The memory system of claim 1, further comprising a shared interface bus communicatively coupling the shared BISA circuit to each memory tile among the plurality of memory tiles, the shared interface bus comprising:
    a shared input bus configured to carry the shared BISA address issued from the shared BISA circuit to each memory tile among the plurality of memory tiles; and
    a shared output bus configured to carry the data stored at the memory address in the received shared BISA address from a memory tile among the plurality of memory tiles having a unique memory tile address matching the memory tile address in the received shared BISA address.

11. The memory system of claim 10, wherein each memory tile among the plurality of memory tiles comprises a data output circuit configured to:
    assert data from the plurality of memory bit cells in the memory tile being on the shared output bus in response to the memory tile address in the received shared BISA address not matching the unique memory tile address; and
    prevent data from the plurality of memory bit cells in the memory tile being asserted on the shared output bus in response to the memory tile address in the received shared BISA address not matching the unique memory tile address.

12. The memory system of claim 11, wherein the data output circuit in each memory tile among the plurality of memory tiles is configured to:
    present a lower impedance to the shared output bus in response to the memory tile address in the received shared BISA address matching the unique memory tile address, to assert the data from the plurality of memory bit cells in the memory tile being on the shared output bus; and
    present a higher impedance to the shared output bus in response to the memory tile address in the received shared BISA address not matching the unique memory tile address, to prevent the data from the plurality of memory bit cells in the memory tile being asserted on the shared output bus.

13. The memory system of claim 10, wherein:
    the shared input bus comprises:
        a shared memory address bus coupled to each memory tile among the plurality of memory tiles, the shared memory address bus configured to carry the memory address of the shared BISA address to each memory tile among the plurality of memory tiles; and a shared memory tile selection bus coupled to each memory tile among the plurality of memory tiles, the shared memory tile selection bus configured to carry the memory tile address of the shared BISA address to each memory tile among the plurality of memory tiles; and the shared output bus comprises a shared output data bus coupled to each memory tile among the plurality of memory tiles, the shared output data bus configured to carry the data stored at the memory address in the received shared BISA address from the memory tile among the plurality of memory tiles having the unique memory tile address matching the memory tile address in the received shared BISA address.

14. The memory system of claim 13, wherein the shared input bus further comprises a shared input data bus coupled to each memory tile among the plurality of memory tiles, the shared input data bus configured to carry data to be written to a memory tile among the plurality of memory tiles having the unique memory tile address matching the memory tile address in the received shared BISA address.

15. The memory system of claim 1, wherein the shared BISA circuit is comprised from the group consisting of a built-in self-test (BIST) circuit, a built-in redundancy analysis (BIRA) circuit, and a built-in self-repair (BISR) circuit.

16. The memory system of claim 1 integrated into an integrated circuit (IC).

17. The memory system of claim 1 integrated into an system-on-a-chip (SoC).

18. The memory system of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A memory system, comprising:
a plurality of means for storing data, each addressable by a unique memory tile address;
a means, coupled to each of the plurality of means for storing data, for analyzing data stored in each of the plurality of means for storing data;
a means for issuing a shared built-in self-analysis (BISA) address comprising a memory tile address indicating a means for storing data among the plurality of means for storing data to be addressed and a memory address to be accessed in the means for storing data;
a means for receiving data stored at the memory address in the means for storing data at the memory tile address;
wherein each of the plurality of means for storing data comprising:
a means for receiving the shared BISA address issued by the means for analyzing data; and
a means for comparing the memory tile address in the received shared BISA address to the unique memory tile address; and a means for providing data stored at the memory address in the received shared BISA address in response to the memory tile address in the received shared BISA address matching the unique memory tile address.

20. A method of accessing data stored in a memory array to be analyzed, comprising:
issuing a shared built-in self-analysis (BISA) address on a shared interface bus coupled to each memory tile among a plurality of memory tiles in a memory array in a memory system, the shared BISA address comprising a memory tile address indicating a memory tile among the plurality of memory tiles to be addressed and a memory address to be accessed in the memory tile;
receiving the shared BISA address on the shared interface bus in each memory tile among the plurality of memory tiles;
comparing the memory tile address in the received shared BISA address to a unique memory tile address in each memory tile among the plurality of memory tiles;
asserting data on the shared interface bus stored at the memory address in the received shared BISA address for the memory tile among the plurality of memory tiles having the unique memory tile address matching the memory tile address in the received shared BISA address; and
analyzing the data on the shared interface bus.

21. The method of claim 20, further comprising not asserting the data on the shared interface bus stored at the memory address in the received shared BISA address for the memory tile among the plurality of memory tiles having the unique memory tile address not matching the memory tile address in the received shared BISA address.

22. The method of claim 20, further comprising receiving the shared BISA address over an external input interface to the memory system.

23. The method of claim 20, further comprising continuing to issue the shared BISA address on the shared interface bus for an entire address range of the plurality of memory tiles.

24. The method of claim 20, further comprising receiving an enable signal, the shared BISA circuit configured to issue the shared BISA address in response to the enable signal indicating an enable state.

25. The method of claim 20, wherein:
issuing the shared BISA address on the shared interface bus to each memory tile among the plurality of memory tiles in the memory array in the memory system comprises issuing the shared BISA address on a shared input bus to each memory tile among the plurality of memory tiles; and
asserting the data on the shared interface bus comprises asserting the data on a shared output bus stored at the memory address in the received shared BISA address for the memory tile among the plurality of memory tiles having the unique memory tile address matching the memory tile address in the received shared BISA address.

26. The method of claim 20, wherein analyzing the data on the shared interface bus comprises comparing the data on the shared interface bus to test the data stored at the memory address in the received shared BISA address for the memory tile among the plurality of memory tiles having the unique memory tile address matching the memory tile address in the received shared BISA address.

27. A built-in memory analysis system, comprising:
a built-in analysis control circuit configured to generate a shared built-in self-analysis (BISA) address over a shared interface bus, the shared BISA address comprising a memory tile address indicating a memory tile among a plurality of memory tiles in a memory system to be addressed and a memory address to be accessed in the memory tile;

the memory system comprising:
- a memory array comprising the plurality of memory tiles, each memory tile among the plurality of memory tiles comprising a plurality of memory bit cells and a unique memory tile address; and
- a shared BISA circuit communicatively coupled to each of the plurality of memory tiles in the memory array;
- wherein the shared BISA circuit configured to:
  - issue the shared BISA address comprising the memory tile address indicating the memory tile among the plurality of memory tiles to be addressed and the memory address to be accessed in the memory tile; and
  - receive data stored at the memory address in the memory tile at the memory tile address; and
- wherein each of the plurality of memory tiles configured to:
  - receive the shared BISA address issued by the shared BISA circuit;
  - compare the memory tile address in the received shared BISA address to the unique memory tile address; and
  - assert the data stored at the memory address in the received shared BISA address in response to the memory tile address in the received shared BISA address matching the unique memory tile address.

28. The built-in memory analysis system of claim 27, wherein the address input interface comprises a JTAG serial interface.

29. The built-in memory analysis system of claim 27, further comprising an integrated circuit (IC) chip comprising the memory system and the built-in analysis control circuit.

30. The built-in memory analysis system of claim 27, further comprising an integrated circuit (IC) chip comprising the memory system, and
  wherein the built-in analysis control circuit is provided external to the IC chip.

* * * * *